US010910240B2

(12) United States Patent
Muramoto

(10) Patent No.: US 10,910,240 B2
(45) Date of Patent: Feb. 2, 2021

(54) SUBSTRATE PROCESSING DEVICE

(71) Applicant: SCREEN Holdings Co., Ltd., Kyoto (JP)

(72) Inventor: Ryo Muramoto, Kyoto (JP)

(73) Assignee: SCREEN Holdings Co., Ltd.

( * ) Notice: Subject to any disclaimer, the term of this patent is extended or adjusted under 35 U.S.C. 154(b) by 105 days.

(21) Appl. No.: 16/081,303

(22) PCT Filed: Feb. 27, 2017

(86) PCT No.: PCT/JP2017/007486
§ 371 (c)(1),
(2) Date: Aug. 30, 2018

(87) PCT Pub. No.: WO2017/154639
PCT Pub. Date: Sep. 14, 2017

(65) Prior Publication Data
US 2019/0013220 A1 Jan. 10, 2019

(30) Foreign Application Priority Data
Mar. 11, 2016 (JP) .................... 2016-048714

(51) Int. Cl.
*H01L 21/67* (2006.01)
*H01L 21/677* (2006.01)
(52) U.S. Cl.
CPC .. *H01L 21/67184* (2013.01); *H01L 21/67167* (2013.01); *H01L 21/67196* (2013.01); *H01L 21/67745* (2013.01); *H01L 21/67748* (2013.01)

(58) Field of Classification Search
CPC .................... H01L 21/67167; H01L 21/67184
See application file for complete search history.

(56) References Cited

U.S. PATENT DOCUMENTS 6,270,306 B1 * 8/2001 Otwell .................... H01L 21/68
414/222.13
6,790,763 B2 * 9/2004 Kondo .............. H01L 21/67167
257/E21.174
(Continued)

FOREIGN PATENT DOCUMENTS

| JP | 2004-071671 A | 3/2004 |
| JP | 2004-119635 A | 4/2004 |

(Continued)

OTHER PUBLICATIONS

International Search Report dated May 23, 2018 in corresponding PCT International Application No. PCT/JP2017/007486.
(Continued)

*Primary Examiner* — James Keenan
(74) *Attorney, Agent, or Firm* — Ostrolenk Faber LLP

(57) ABSTRACT

A first transfer robot carries a substrate into and out of a container. A second transfer robot receives and delivers the substrate from and to the first transfer robot, and carries the substrate into and out of a first processing portion through a first exit/entrance port. A third transfer robot receives and delivers the substrate from and to the second transfer robot, carries the substrate into and out of a second processing portion through a second exit/entrance port, and carries the substrate into and out of a third processing portion through a third exit/entrance port.

11 Claims, 8 Drawing Sheets

(56) References Cited

U.S. PATENT DOCUMENTS

| | | | | |
|---|---|---|---|---|
| 6,852,194 | B2* | 2/2005 | Matsushita | H01L 21/67184 118/719 |
| 6,977,014 | B1* | 12/2005 | Stevens | H01L 21/67017 118/719 |
| 7,090,741 | B2* | 8/2006 | Narushima | H01L 21/67017 118/719 |
| 7,129,147 | B2* | 10/2006 | Kumagai | H01L 21/67167 438/401 |
| 9,117,860 | B2* | 8/2015 | Boyd | H01L 21/288 |
| 10,086,511 | B2* | 10/2018 | van der Meulen | H01L 21/67184 |
| 10,510,566 | B2* | 12/2019 | Lin | H01L 21/67745 |
| 2004/0021856 | A1 | 2/2004 | Nishiyama et al. | 356/237.2 |
| 2004/0037677 | A1 | 2/2004 | Koyama et al. | 414/222.01 |
| 2005/0221603 | A1* | 10/2005 | Morad | H01L 21/67167 438/622 |
| 2006/0021575 | A1 | 2/2006 | Ishizawa et al. | 118/719 |
| 2010/0249993 | A1 | 9/2010 | Mitsuyoshi | 700/228 |
| 2015/0287624 | A1 | 10/2015 | Hatano et al. | 414/222.13 |
| 2017/0263491 | A1* | 9/2017 | Muramoto | H01L 21/67167 |
| 2019/0019706 | A1* | 1/2019 | Takusari | H01L 21/67781 |

FOREIGN PATENT DOCUMENTS

| | | | | |
|---|---|---|---|---|
| JP | 2005-101080 A | 4/2005 | | |
| JP | 2014-007279 A | 1/2014 | | |
| JP | 2014-067839 A | 4/2014 | | |
| KR | 10-2010-0109357 A | 10/2010 | | |
| WO | WO-2007023639 A1 * | 3/2007 | | H01L 21/67167 |
| WO | WO-2011142192 A1 * | 11/2011 | | H01L 21/67201 |

OTHER PUBLICATIONS

Written Opinion dated May 23, 2018 in corresponding PCT International Application No. PCT/JP2017/007486.

International Preliminary Report on Patentability (Chapter I) dated Sep. 20, 2018 with Notification from the International Bureau (Form PCT/IB/326) in corresponding PCT International Application No. PCT/JP2017/007486 in Japanese.

International Preliminary Report on Patentability (Chapter I) dated Sep. 20, 2018 with Notification from the International Bureau (Form PCT/IB/338) in corresponding PCT International Application No. PCT/JP2017/007486 in English.

* cited by examiner

SUBSTRATE PROCESSING DEVICE

CROSS-REFERENCE TO RELATED APPLICATIONS

The present application is a 35 U.S.C. §§ 371 national phase conversion of PCT/JP2017/007486, filed Feb. 27, 2017, which claims priority to Japanese Patent Application No. 2016-048714, filed Mar. 11, 2016, the contents of both of which are incorporated herein by reference. The PCT International Application was published in the Japanese language.

TECHNICAL FIELD

The present invention relates to a substrate processing apparatus. Examples of substrates to be processed include semiconductor wafers, substrates for liquid crystal display devices, substrates for plasma displays, substrates for FEDs (Field Emission Displays), substrates for optical disks, substrates for magnetic disks, substrates for magneto-optical disks, substrates for photomasks, ceramic substrates and substrates for solar cells.

BACKGROUND ART

An example of a single substrate processing-type substrate processing apparatus which is used in the manufacturing process of a semiconductor device is disclosed in following Patent Literature 1. This apparatus comprises an indexer block and a plurality of processing blocks. The indexer block includes a cassette placing table on which a cassette accommodating a plurality of substrates is placed, and an indexer transfer mechanism for moving the substrate into and out of the cassette. Three processing blocks are located in a direction away from the cassette placing table. Each processing block includes a processing portion which processes a substrate and a main transfer robot which moves the substrate in and out from the processing portion.

CITATION LIST

Patent Literature

Patent Literature 1: United State Patent Application Publication No. 2004/037677

SUMMARY OF THE INVENTION

Technical Problem

In a configuration of Patent Literature 1, the main transfer mechanism faces a substantially center of the processing portion. Therefore, one main transfer mechanism is needed for each of the processing portion, so that the cost of the substrate processing apparatus is increased. On the other hand, in order to reduce the number of the main transfer mechanism, it is conceivable that a processing portion next to a processing portion which faces the main transfer mechanism can be accessed by the main transfer mechanism. However, in this case, since a transfer path to the next processing portion is long, there is a possibility that the substrate cannot be transfer efficiently.

Hence, one object of this invention is to provide a substrate processing apparatus capable of carrying a substrate efficiently and reducing the number of the processing portion in a configuration in which three processing portions located in a direction away from a holding unit which holds container accommodating the substrate.

Solution to Problem

This invention provides a substrate processing apparatus includes a holding unit which holds a container accommodating a substrate, a first processing portion which processes the substrate and has a first exit/entrance port for moving the substrate into and out, a second processing portion which processes the substrate, which has a second exit/entrance port for moving the substrate into and out, and which is located on the opposite side to the holding unit with respect to the first processing portion, a third processing portion which processes the substrate, which has a third exit/entrance port for moving the substrate into and out, and which is located on the opposite side to the holding unit with respect to the second processing portion, a transfer path which extends from the holding unit, and through which the substrate which is transferred between the container held by the holding unit, and the first processing portion, the second processing portion and the third processing portion, a first transfer robot which carries the substrate into and out of the container held by the holding unit, a second transfer robot which receives and delivers the substrate from and to the first transfer robot, and carries the substrate into and out of the first processing portion through the first exit/entrance port, and a third transfer robot which receives and delivers the substrate from and to the second transfer robot, carries the substrate into and out of the second processing portion through the second exit/entrance port, and carries the substrate into and out of the third processing portion through the third exit/entrance port.

According this configuration, the second processing portion is located on the opposite side to the holding unit with respect to the first processing portion and the third processing portion is located on the opposite side to the holding unit with respect to the second processing portion. That is, the first processing portion, the second processing portion and the third processing portion are aligned in the direction away from the holding unit in this order.

The second transfer robot carries the substrate into and out of the first processing portion through the first exit/entrance port. Further, the third transfer robot carries the substrate into and out of the second processing portion through the second exit/entrance port and carries the substrate into and out of the third processing portion through the third exit/entrance port. Therefore, as compared with a configuration in which one transfer robot is provided for each of three processing portion, the number of the transfer robots can be reduced. The number of times the substrate is received and delivered between the first transfer robot, the second transfer robot and the third transfer robot is reduced, and thus it is possible to enhance the transfer efficiency.

As described above, in the configuration in which three processing portions are located so as to be aligned in the direction away from the holding unit, while the substrate is efficiently transferred, the number of transfer robots can be reduced.

The processing portion includes at least one single substrate processing-type processing unit which processes the substrates one by one. The processing portion may include a plurality of single substrate processing-type processing units which are stacked in layers in an up/down direction.

In a preferred embodiment of the present invention, the second transfer robot and the third transfer robot are located between the first processing portion and the third processing portion in a direction in which the transfer path extends.

According to this configuration, the second transfer robot and the third transfer robot can be located between the first processing portion and the third processing portion. Therefore, it is possible to design a layout in which the second transfer robot easily access the first processing portion, in which the third transfer robot easily access the second processing portion and the third processing portion, and in which the second transfer robot and the third transfer robot easily receive and deliver the substrate each other.

In a preferred embodiment of the present invention, the second exit/entrance port is positioned at the opposite side to the holding unit side with respect to the center of the second processing portion in a direction in which the transfer path extends.

According to this configuration, since the second exit/entrance port is positioned at the opposite side to the holding unit side with respect to the center of the second processing portion in a direction in which the transfer path extends, the third transfer robot easily access the second exit/entrance port. Thus, the third transfer robot can efficiently carry the substrate into and out of the second processing portion.

In a preferred embodiment of the present invention, the second transfer robot is located so as to face the first exit/entrance port. Further, the third transfer robot is located so as to face the second exit/entrance port and the third exit/entrance port.

According to this configuration, since the second transfer robot is located so as to face the first exit/entrance port, the second transfer robot can easily carry the substrate into and out of the first processing portion. Hence, the second transfer robot can efficiently carry the substrate into and out of the first processing portion. Since the third transfer robot is located so as to face the second exit/entrance port and the third exit/entrance port, the third transfer robot can easily carry the substrate into and out of the second exit/entrance port and the third exit/entrance port. Thus, the third transfer robot can efficiently carry the substrate into and out of the second processing portion and the third processing portion.

In a preferred embodiment of the present invention, the substrate processing apparatus further includes a first placement unit which is located within the transfer path, and on which the substrate is placed so that the substrate is received and delivered between the first transfer robot and the second transfer robot, and a second placement unit which is located within the transfer path and on which the substrate is placed so that the substrate is received and delivered between the second transfer robot and the third transfer robot.

According to this configuration, the substrate can be placed on the first placement unit when the substrate is received and delivered between the first transfer robot and the second transfer robot. Therefore, it is not necessary to synchronize the timing at which the first transfer robot and the second transfer robot access the first placement unit in order to receive and deliver the substrate. Thus, the degree of freedom of the operation of the first transfer robot and the second transfer robot is increased. Accordingly, it is possible to enhance the transfer efficiency of the substrate by the first transfer robot and the second transfer robot.

Further, the substrate can be placed on the second placement unit when the substrate is received and delivered between the second transfer robot and the third transfer robot. Therefore, it is not necessary to synchronize the timing at which the second transfer robot and the third transfer robot access the second placement unit in order to receive and deliver the substrate. Thus, the degree of freedom of the operation of the second transfer robot and the third transfer robot is increased. Accordingly, it is possible to enhance the transfer efficiency of the substrate by the second transfer robot and the third transfer robot. Consequently, it is possible to enhance the transfer efficiency of the substrate in the substrate processing apparatus.

In a preferred embodiment of the present invention, the first placement unit is located within the first transfer robot and the second transfer robot. According to this configuration, the first placement unit is located within the first transfer robot and the second transfer robot. Hence, it is possible to shorten a distance over which the first transfer robot and the second transfer robot are moved when the substrate is received and delivered between the first transfer robot and the second transfer robot. Consequently, it is possible to enhance the transfer efficiency of the substrate.

In a preferred embodiment of the present invention, the substrate processing apparatus further includes a raising/lowering unit which is located within the transfer path, and raises and lowers the second transfer robot. Also, the raising/lowering unit is positioned between the first transfer robot and the second transfer robot.

According to this configuration, the raising/lowering unit is positioned between the first transfer robot and the second transfer robot. Hence, the second transfer robot can be raised and lowered, while suppressing the influence on the disposition of the third transfer robot as compared with the case where the raising/lowering unit is positioned on the opposite side of the first transfer robot with respect to the second transfer robot. In this way, the degree of freedom of the disposition of the third transfer robot is increased. Consequently, it is possible to easily perform a design for reducing the size of the substrate processing apparatus and maximizing the transfer efficiency of the substrate.

In a preferred embodiment of the present invention, the transfer path extends linearly from the holding unit toward the second transfer robot. Further, the first placement unit and the raising/lowering unit are aligned in a direction crossing the direction in which the transfer path extends.

According this configuration, the first placement unit and the raising/lowering unit are aligned in the direction crossing the direction in which the linear transfer path extends. Therefore, the first placement unit and the raising/lowering unit can be located within the transfer path without the length of the transfer path from the first transfer robot and the second transfer robot increased. Thereby, it is possible to reduce the size of the substrate processing apparatus and to enhance the transfer efficiency of the substrate W.

In a preferred embodiment of the present invention, the second placement unit is located within the second transfer robot and the third transfer robot.

According to this configuration, the second placement unit is positioned between the second transfer robot and the third transfer robot. Therefore, it is possible to shorten a distance over which the second transfer robot and the third transfer robot are moved so that the substrate is received and delivered between the second transfer robot and the third transfer robot. Consequently, it is possible to enhance the transfer efficiency of the substrate.

In a preferred embodiment of the present invention, the substrate processing apparatus includes a first processing block which is configured with a pair of the first processing portions which are provided across the transfer path, a second processing block which is configured with a pair of the second processing portions which are provided across the transfer path, and a third processing block which is configured with a pair of the third processing portions which are provided across the transfer path.

According to this configuration, in each of the processing blocks, the pairs of the processing portion face each other across the transfer path. Thus, it is possible to increase the number of processing portions into and out of which the second transfer robot and the third transfer robot carry the substrate.

The aforementioned or other objects, features and effects of the present invention will be clarified by the description of preferred embodiments to be described below with reference to accompanying drawings.

DETAILED DESCRIPTION OF THE PREFERRED EMBODIMENTS

Figure 1:
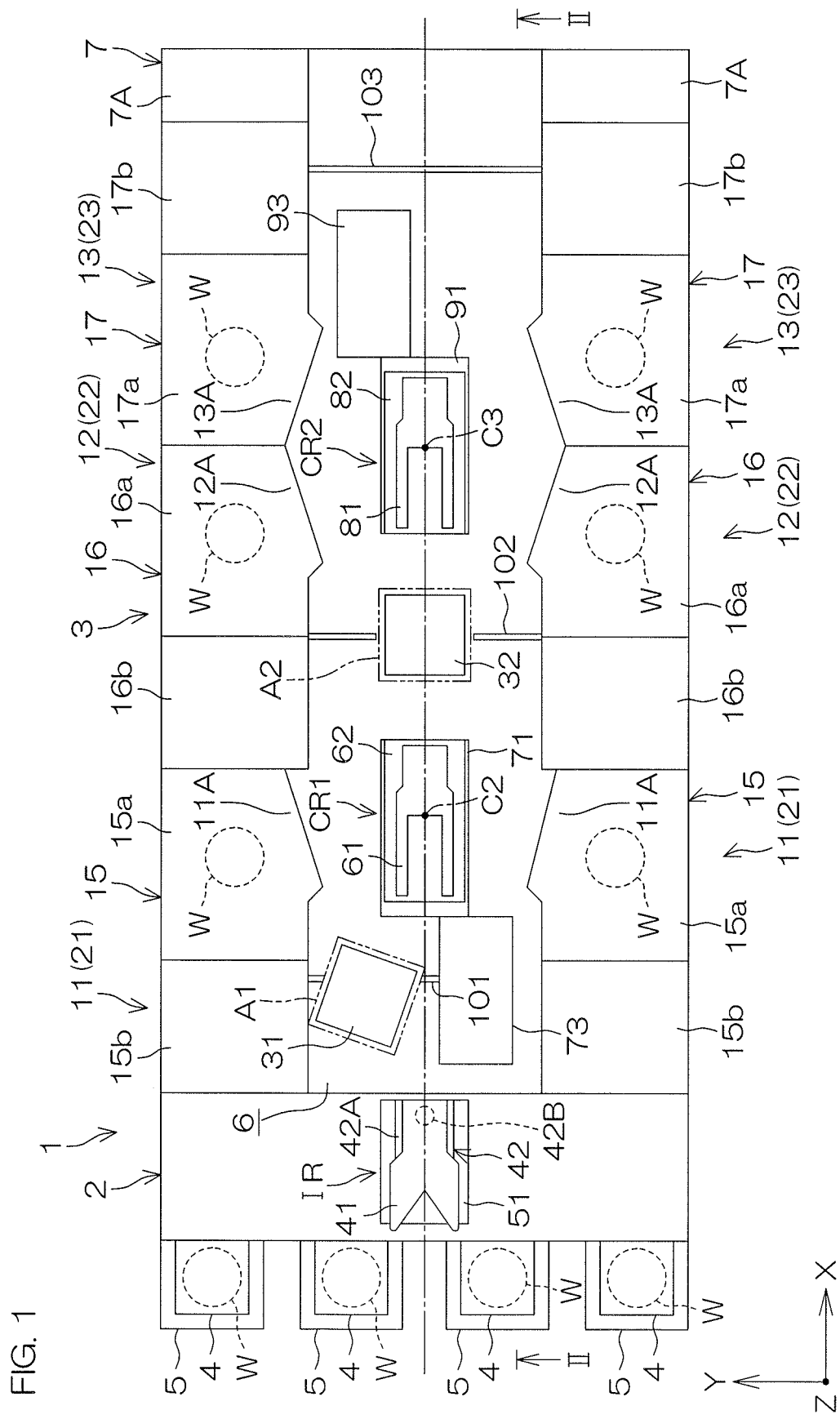
FIG. 1 is a schematic plan view for illustrating the layout of the interior of a substrate processing apparatus according to a first preferred embodiment of the present invention.
Figure 2:
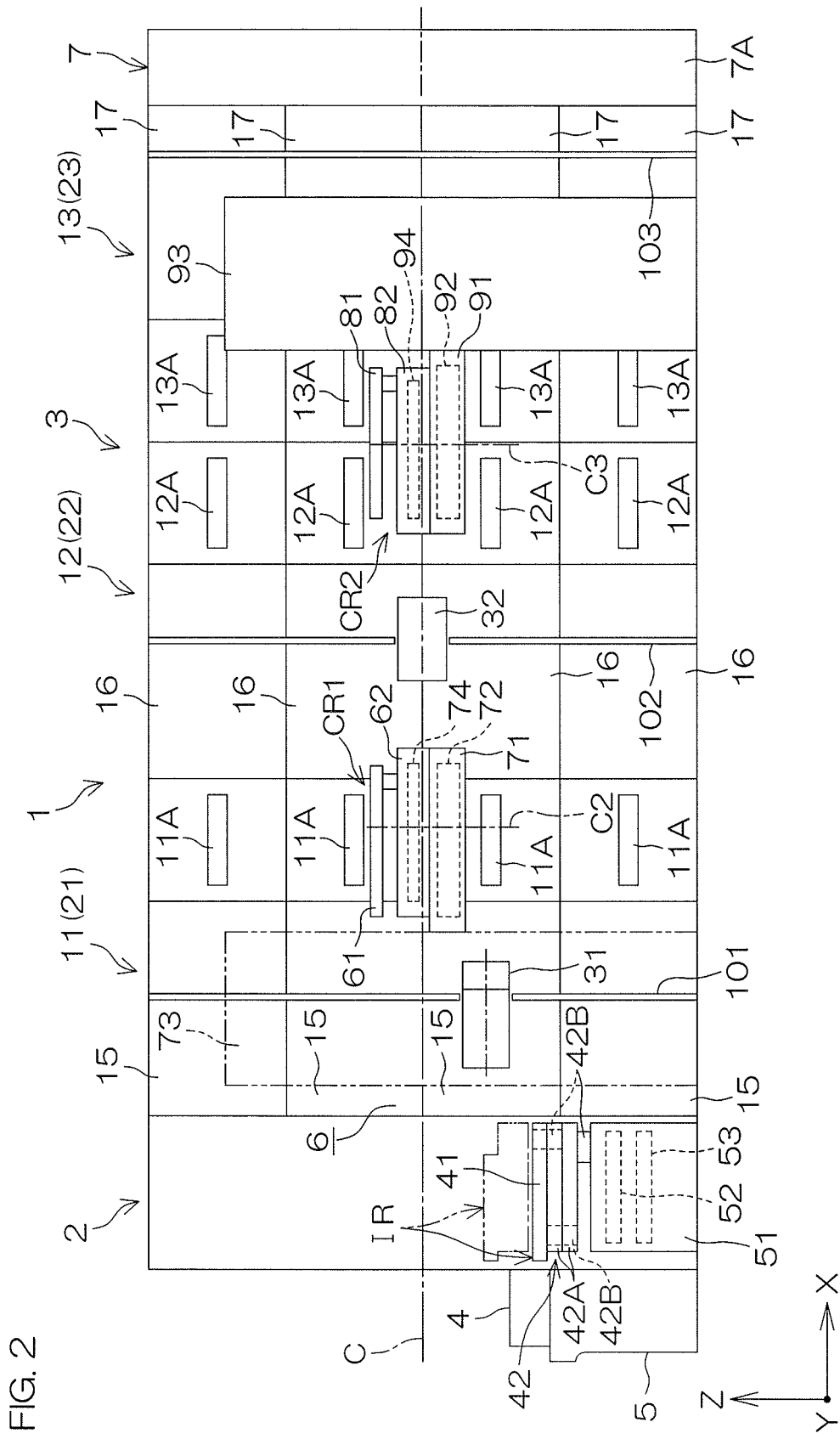
FIG. 2 is a schematic vertical cross-sectional view taken along line II-II of FIG. 1.

FIG. 1 is a schematic plan view for illustrating the layout of the interior of a substrate processing apparatus 1 according to a first preferred embodiment of the present invention. FIG. 2 is a schematic vertical cross-sectional view taken along line II-II of FIG. 1.

The substrate processing apparatus 1 is a single substrate processing-type apparatus which performs various types of processing such as cleaning processing and etching processing on substrates W such as semiconductor wafers one by one. The substrate processing apparatus 1 includes an indexer section 2 which holds an unprocessed substrate W and a processed substrate W, a processing section 3 which processes the substrate W and a power supply section 7 which supplies power to the indexer section 2 and the processing section 3. The indexer section 2, the processing section 3 and the power supply section 7 are aligned along a horizontal direction. The indexer section 2 is adjacent to the processing section 3. The power supply section 7 is adjacent to the processing section 3 from the side opposite to the indexer section 2.

The indexer section 2 includes a holding unit 5 on which a container 4 accommodating (housing) the substrate W is placed and which holds the container 4, and an indexer robot IR which carries the substrate W into and out of the container 4 on the holding unit 5. The container 4 is also called a carrier. The container 4 is, for example, configured such that a plurality of substrates W in a horizontal posture are held in a stacked state with a space in an up/down direction. For example, a plurality of holding units 5 are provided so as to be aligned in parallel. One container 4 can be held by each of the holding units 5. The indexer robot IR is located substantially in the center of the indexer section 2 in a direction in which the holding units 5 are aligned. The indexer robot IR rotates, expands and contracts an indexer hand 41 which will be described later, and thereby can access all the holding units 5 in the indexer section 2. The indexer robot IR is an example of a first transfer robot.

The processing section 3 includes a first processing block 21, a second processing block 22 and a third processing block 23. The second processing block 22 is adjacent to the first processing block 21 from the side opposite to the indexer section 2. The third processing block 23 is adjacent to the second processing block 22 from the side opposite to the first processing block 21.

The first processing block 21 includes a pair of first processing portions 11 which respectively perform various types of processing such as cleaning processing and etching processing on the substrate W. The second processing block 22 includes a pair of second processing portions 12 which respectively perform various types of processing such as cleaning processing and etching processing on the substrate W. The third processing block 23 includes a pair of third processing portions 13 which respectively perform various types of processing such as cleaning processing and etching processing on the substrate W.

Each of the first processing portions 11 includes a plurality of (for example, four) first processing units 15 which are stacked in layers in the up/down direction. Each of the second processing portions 12 includes a plurality of (for example, four) second processing units 16 which are stacked in layers in the up/down direction. Each of the third processing portions 13 includes a plurality of (for example, four) third processing units 17 which are stacked in layers in the up/down direction. The processing units 15 to 17 are single substrate processing-type processing units which process the substrates W one by one.

The processing section 3 further includes a first main transfer robot CR1 which receives and delivers the substrate W from and to the indexer robot IR and carries the substrate W into and out of the first processing portions 11. The processing section 3 further includes a second main transfer robot CR2 which receives and delivers the substrate W from and to the first main transfer robot CR1 and carries the substrate W into and out of the second processing portions 12 and the third processing portions 13.

The first main transfer robot CR1 is an example of a second transfer robot. The second main transfer robot CR2 is an example of a third transfer robot. The indexer robot IR, the first main transfer robot CR1 and the second main transfer robot CR2 are aligned substantially in a straight line in plan view.

The substrate processing apparatus 1 further includes a transfer path 6 which extends in the horizontal direction. The transfer path 6 extends, for example, linearly from the indexer section 2 toward the first main transfer robot CR1. In the following description, the direction in which the transfer path 6 extends is referred to as an "X direction." The X direction is also a direction which is perpendicular to the direction in which the plurality of the holding units 5 are aligned. A horizontal direction perpendicular to the X direction is referred to as a "Y direction," and an up/down direction perpendicular to the X direction and the Y direction is referred to as a "Z direction."

The second processing portions 12 are located on the side opposite to the holding units 5 with respect to the first processing portions 11 in the X direction. The third processing portions 13 are located on the side opposite to the holding units 5 with respect to the second processing portions 12 in the X direction. In other words, the first processing portions 11 are close processing portions which are located closest to the holding units 5, and the third processing portions 13 are remote processing portions which are located farthest from the holding units 5. The first processing portions 11, the second processing portions 12 and the third processing portions 13 are aligned in this order in a direction away from the holding units 5. The first main transfer robot CR1 and the second main transfer robot CR2 are positioned between the first processing portion 11 and the third processing portion 13 in the X direction. The first main transfer robot CR1 is located in the vicinity of a boundary between the first processing portions 11 and the second processing portions 12 in the X direction. The second main transfer robot CR2 is located in the vicinity of a boundary between the second processing portions 12 and the third processing portions 13 in the X direction. The transfer path 6 is extended, in plan view, from the holding units 5 so as to be passed through to the same lateral side of the first processing portions 11, the second processing portions 12 and the third processing portions 13.

The pair of first processing portions 11 are provided symmetrically with respect to the transfer path 6. Each of the first processing units 15 of the first processing portions 11 has a longitudinal shape in the X direction. Each of the first processing units 15 includes a first processing chamber 15a which accommodates (houses) the substrate W in order to process the substrate W with a processing liquid and a fluid box 15b which accommodates (houses) pipes for supplying a fluid such as the processing liquid used within the first processing chamber 15a in order to process the substrate W. The first processing chamber 15a is located on the side opposite to the holding units 5 with respect to the fluid box 15b in the X direction. The first processing chamber 15a may be adjacent to the fluid box 15b.

The first processing portion 11 has, in a portion on the side opposite to the side of the holding unit 5 and on the side facing the transfer path 6, a first exit/entrance port 11A through which the substrate W is moved in and out. Specifically, the first exit/entrance port 11A is an opening through which the substrate W is moved into and out of the first processing chamber 15a of the first processing portion 11, and is provided in each of the first processing units 15. The first exit/entrance port 11A is provided in a portion on the side opposite to the side of the holding unit 5 with respect to the center of the first processing portion 11 in the X direction. The first exit/entrance port 11A may be provided at an end portion of the first processing portion 11 on the side opposite to the side of the holding unit 5 in the X direction. In the first exit/entrance port 11A, an openable shutter (not shown) may be provided.

The pair of second processing portions 12 are provided symmetrically with respect to the transfer path 6. Each of the second processing units 16 of the second processing portions 12 has a longitudinal shape in the X direction. Each of the second processing units 16 includes a second processing chamber 16a which accommodates the substrate W in order to process the substrate W with the processing liquid and a fluid box 16b which accommodates pipes for supplying a fluid such as the processing liquid used within the second processing chamber 16a in order to process the substrate W. The second processing chamber 16a is located on the side opposite to the holding units 5 with respect to the fluid box 16b in the X direction.

The second processing portion 12 has, in a portion on the side opposite to the side of the holding unit 5 and on the side facing the transfer path 6, a second exit/entrance port 12A through which the substrate W is moved in and out. Specifically, the second exit/entrance port 12A is an opening through which the substrate W is moved into and out of the second processing chamber 16a of the second processing portion 12, and is provided in each of the second processing units 16. The second exit/entrance port 12A is provided in a portion on the side opposite to the side of the holding unit 5 with respect to the center of the second processing portions 12 in the X direction. The second exit/entrance port 12A may be provided at an end portion of the second processing portion 12 on the side opposite to the side of the holding unit 5 in the X direction. In the second exit/entrance port 12A, an openable shutter (not shown) may be provided.

The pair of third processing portions 13 are provided symmetrically with respect to the transfer path 6. Each of the third processing units 17 of the third processing portions 13 has a longitudinal shape in the X direction. Each of the third processing units 17 includes a third processing chamber 17a which accommodates the substrate W in order to process the substrate W with the processing liquid and a fluid box 17b which accommodates pipes for supplying a fluid such as the processing liquid used within the third processing chamber 17a in order to process the substrate W. The third processing chamber 17a is located on the side opposite to the holding units 5 with respect to the fluid box 17b in the X direction.

The third processing portion 13 has, in a portion on the side of the holding unit 5 and on the side facing the transfer path 6, a third exit/entrance port 13A through which the substrate W is moved in and out. Specifically, the third exit/entrance port 13A is an opening through which the substrate W is moved into and out of the third processing chamber 17a of the third processing portion 13, and is provided in each of the third processing units 17. The third exit/entrance port 13A is provided in a portion on the side of the holding unit 5 with respect to the center of the third processing portions 13 in the X direction. The third exit/entrance port 13A may be provided at an end portion of the third processing portion 13 on the side of the holding unit 5 in the X direction. In the third exit/entrance port 13A, an openable shutter (not shown) may be provided.

The power supply section 7 includes a pair of breaker units 7A. The breaker units 7A are located on the side opposite to the holding units 5 with respect to the third processing portions 13. Unlike the present preferred embodiment, a configuration may be adopted in which only one of the pair of breaker units 7A is provided.

The substrate processing apparatus 1 further includes a first placement unit 31 on which the substrate W is placed so that the substrate W is received and delivered between the indexer robot IR and the first main transfer robot CR1 and a second placement unit 32 on which the substrate W is placed so that the substrate W is received and delivered between the first main transfer robot CR1 and the second main transfer robot CR2.

The first placement unit 31 is located in a reception/delivery region A1. The reception/delivery region A1 is a predetermined region within the transfer path 6, and is located between the indexer robot IR and the first main transfer robot CR1. The substrate W is received and delivered in the reception/delivery region A1 between the indexer robot IR and the first main transfer robot CR1.

The second placement unit 32 is located in a reception/delivery region A2. The reception/delivery region A2 is a predetermined region within the transfer path 6, and is located between the first main transfer robot CR1 and the second main transfer robot CR2. The substrate W is received and delivered in the reception/delivery region A2 between the first main transfer robot CR1 and the second main transfer robot CR2.

The indexer robot IR is a horizontal articulated robot. The indexer robot IR includes the indexer hand 41 which can hold the substrate W and an indexer arm 42 in which the indexer hand 41 is attached to its tip end. The tip end of the indexer hand 41 is formed in the shape of, for example, a fork. The indexer arm 42 includes a plurality of (for example, two) links 42A the link 42A on the most tip end side in the indexer arm 42 and the indexer hand 41 are connected with a joint 42B, and the links 42A are connected to each other with another joint 42B. The indexer hand 41 and the links 42A are individually and independently rotated around the joints 42B.

The indexer section 2 further includes a support member 51 which supports the indexer robot IR, a movement unit 52 which independently rotates the indexer hand 41 and the plurality of the links 42A around the joints 42B to move the indexer hand 41 and an indexer robot raising/lowering unit 53 which raises and lowers the indexer robot IR. The movement unit 52 and the indexer robot raising/lowering unit 53 are incorporated in, for example, the support member 51. The indexer robot raising/lowering unit 53 is an example of a first transfer robot raising/lowering unit which raises and lowers the indexer robot IR serving as the first transfer robot. The indexer robot raising/lowering unit 53 includes, for example, a ball screw mechanism (not shown) and an electric motor (not shown) which applies a driving force to the ball screw mechanism.

The indexer robot raising/lowering unit 53 raises and lowers the indexer robot IR in the Z direction between a lower position (position shown by solid lines in FIG. 2) and an upper position (position indicated by chain double-dashed lines in FIG. 2). The lower position is a position, of the indexer robot IR, at which the indexer hand 41 of the indexer robot IR faces the lower end of the container 4 held by the holding unit 5 in the horizontal direction. The upper position is a position, of the indexer robot IR, in which the indexer hand 41 faces the first placement unit 31 from the horizontal direction.

The first placement unit 31 is positioned in the Z direction between the container 4 held by the holding unit 5 and a center C of the first processing portions 11 in the Z direction. Specifically, the first placement unit 31 is located, in the Z direction, in a center position between the lower position of the indexer robot IR and the center C. More specifically, a portion of the first placement unit 31 on which the substrate W is placed is positioned, in the Z direction, at least between the container 4 and the center C. The portion of the first placement unit 31 on which the substrate W is placed is, for example, a center of the first placement unit 31 in the Z direction. Further, the portion of the first placement unit 31 on which the substrate W is placed is positioned at the center position between the lower position of the indexer robot IR and the center C.

The center C of the first processing portions 11 is determined based on the positions, in the Z direction, of the exit/entrance ports 11A of the plurality of the first processing units 15 stacked in layers. Specifically, the center C is a center position between the position of the uppermost first exit/entrance port 11A in the Z direction and the position of the lowermost first exit/entrance port 11A in the Z direction. The center C is also the center of the second processing portions 12 and the third processing portions 13 in the Z direction. The second placement unit 32 is located such that a portion on which the substrate W is placed in the second placement unit 32 coincides with the center C. The portion on which the substrate W is placed in the second placement unit 32 is, for example, a center of the second placement unit 32 in the Z direction.

The indexer robot IR can make the indexer hand 41 face the container 4 held by the holding unit 5 from the horizontal direction. In this state, the indexer robot IR accesses the container 4 and thereby can carry the substrate W into and out of the container 4.

The indexer robot IR can make the indexer hand 41 face the first placement unit 31 from the horizontal direction. In this state, the indexer robot IR accesses the reception/delivery region A1 and thereby can place the substrate W on the first placement unit 31 and receive the substrate W placed on the first placement unit 31.

The processing section 3 includes the first main transfer robot CR1 and a first main transfer robot raising/lowering unit 73 which raises and lowers the first main transfer robot CR1 in the Z direction. The first main transfer robot raising/lowering unit 73 is an example of a second transfer robot raising/lowering unit which raises and lowers the first main transfer robot CR1 serving as the second transfer robot. In FIG. 2, for convenience of description, the first main transfer robot raising/lowering unit 73 is indicated by chain double-dashed lines.

The first main transfer robot CR1 includes a first main transfer hand 61 which can hold the substrate W, a holding portion 62 which holds the first main transfer hand 61 such that the first main transfer hand 61 can be linearly advanced and retracted and a support member 71 which rotatably supports the holding portion 62. The tip end of the first main transfer hand 61 is formed in the shape of, for example, a fork. In the holding portion 62, a first main transfer hand advance/retraction unit 74 which advances and retracts the first main transfer hand 61 in the horizontal direction is incorporated. In the support member 71, a first main transfer robot pivoting unit 72 which rotates the holding portion 62 around a vertical axis C2 is incorporated. The first main robot pivoting unit 72 is, for example, an electric motor.

The first main transfer hand 61 can be moved by the first main transfer hand advance/retraction unit 74 between a retraction position and an advance position. The retraction position is a position where the entire first main transfer hand 61 is located on the holding portion 62 in plan view. The advance position is a position where the tip end of the first main transfer hand 61 is linearly advanced most externally from the holding portion 62 so as to be moved away from the holding portion 62.

The holding portion 62 can be rotated around the vertical axis C2 on the support member 71 by the first main transfer robot pivoting unit 72.

The first main transfer robot raising/lowering unit 73 is located within the transfer path 6. The first main transfer robot raising/lowering unit 73 is positioned between the indexer robot IR and the first main transfer robot CR1. The reception/delivery region A1 and the first main transfer robot raising/lowering unit 73 are aligned in plan view in a direction intersecting the X direction. Specifically, the reception/delivery region A1 and the first main transfer robot raising/lowering unit 73 are adjacent in the Y direction. The center of the reception/delivery region A1 in plan view and the center of the first main transfer robot raising/lowering unit 73 in plan view may be aligned in the Y direction. Unlike the present preferred embodiment, the center of the reception/delivery region A1 in plan view and the center of the first main transfer robot raising/lowering unit 73 in plan view may be aligned in the horizontal direction other than the X direction and the Y direction. The horizontal direction other than the X direction and the Y direction is a direction which intersects the X direction, for example, a direction which is inclined with respect to both the X direction and the Y direction.

The first main transfer robot raising/lowering unit 73 is coupled to the first main transfer robot CR1 in the support member 71. The first main transfer robot raising/lowering unit 73 raises and lowers the support member 71 in the Z direction to raise and lower the first main transfer robot CR1 in the Z direction. The first main transfer robot raising/lowering unit 73 includes a drive motor (not shown) which drives the raising and lowering of the support member 71 and a rail (not shown) which guides the raising and lowering of the support member 71.

The first main transfer robot raising/lowering unit 73 drives the raising and lowering of the first main transfer robot CR1, and thus the first main transfer robot CR1 is raised and lowered between a lower position opposite the first exit/entrance port 11A of the lowermost first processing unit 15 in the horizontal direction and an upper position opposite the first exit/entrance port 11A of the uppermost first processing unit 15 in the horizontal direction. In a predetermined position between the lower position and the upper position, the first main transfer robot CR1 faces the first exit/entrance port 11A of the first processing unit 15 located between the uppermost first processing unit 15 and the lowermost first processing unit 15. As described above, the first main transfer robot CR1 is located so as to face the first exit/entrance port 11A.

The first main transfer robot CR1 can make the first main transfer hand 61 face the first exit/entrance port 11A of the first processing unit 15 from the horizontal direction. In this state, the first main transfer robot CR1 accesses the first processing unit 15 through the first exit/entrance port 11A, and thereby can carry the substrate W into and out of the first processing unit 15.

The first main transfer robot CR1 can make the first main transfer hand 61 face the first placement unit 31 from the horizontal direction. In this state, the first main transfer robot CR1 accesses the first placement unit 31 and thereby can place the substrate W on the first placement unit 31 and receive the substrate W placed on the first placement unit 31.

The first main transfer robot CR1 is preferably located such that a distance between a position where the substrate W is placed within the first processing chamber 15a of the first processing unit 15 and the first main transfer robot CR1, a distance between a position where the substrate W is placed in the first placement unit 31 and the first main transfer robot CR1 and a distance between a position where the substrate W is placed in the second placement unit 32 and the first main transfer robot CR1 are equal to each other in plan view.

The processing section 3 includes the second main transfer robot CR2 and a second main transfer robot raising/lowering unit 93 which raises and lowers the second main transfer robot CR2 in the Z direction. The second main transfer robot raising/lowering unit 93 is an example of a third transfer robot raising/lowering unit which raises and lowers the second main transfer robot CR2 serving as the third transfer robot.

The second main transfer robot CR2 includes a second main transfer hand 81 which can hold the substrate W, a holding portion 82 which holds the second main transfer hand 81 such that the second main transfer hand 81 can be linearly advanced and retracted, and a support member 91 which rotatably supports the holding portion 82. The tip end of the second main transfer hand 81 is formed in the shape of, for example, a fork. In the holding portion 82, a second main transfer hand advance/retraction unit 94 which advances and retracts the second main transfer hand 81 in the horizontal direction is incorporated. In the support member 91, a second main transfer robot pivoting unit 92 which rotates the holding portion 82 around a vertical axis C3 is incorporated.

The second main transfer hand 81 can be moved by the second main transfer hand advance/retraction unit 94 between a retraction position where the entire second main transfer hand 81 is located on the holding portion 82 in plan view and an advance position where the tip end of the second main transfer hand 81 is linearly advanced most externally from the holding portion 82 so as to be moved away from the holding portion 82.

The holding portion 82 can be rotated around the vertical axis C3 on the support member 91 by the second main transfer robot pivoting unit 92.

The second main transfer pivoting unit 92 and the second main transfer hand advance/retraction unit 94 may be, for example, incorporated in the support member 91. The second main transfer pivoting unit 92 rotates the holding portion 82 which holds the second main transfer hand 81 around the vertical axis C3. The second main transfer robot pivoting unit 92 is, for example an electric motor.

The second main transfer robot raising/lowering unit 93 is positioned on the side opposite to the holding units 5 with respect to the second main transfer robot CR2. The second main transfer robot raising/lowering unit 93 is coupled to the second main transfer robot CR2 in the support member 91. The second main transfer robot raising/lowering unit 93 raises and lowers the support member 91 to raise and lower the second main transfer robot CR2 in the Z direction. The second main transfer robot raising/lowering unit 93 includes a drive motor (not shown) which drives the raising and lowering of the support member 91 and a rail (not shown) which guides the raising and lowering of the support member 91.

The second main transfer robot raising/lowering unit 93 drives the raising and lowering of the second main transfer robot CR2, and thus the second main transfer robot CR2 is raised and lowered between a lower position and an upper position. The lower position is a position, of the second main transfer robot CR2, when the second main transfer robot CR2 faces the second exit/entrance port 12A of the lowermost second processing unit 16 from the horizontal direction. The upper position is a position, of the second main transfer robot CR2, when the second main transfer robot CR2 faces the second exit/entrance port 12A of the uppermost second processing unit 16. At a predetermined position between the lower position and the upper position, the second main transfer robot CR2 faces the second exit/entrance port 12A of the second processing unit 16 between the uppermost second processing unit 16 and the lowermost second processing units 16.

When the second main transfer robot CR2 is at the lower position, the second main transfer robot CR2 also faces the third exit/entrance port 13A of the lowermost third processing unit 17 from the horizontal direction. When the second main transfer robot CR2 is at the upper position, the second main transfer robot CR2 also faces the third exit/entrance port 13A of the uppermost third processing unit from the horizontal direction. At the predetermined position between the lower position and the upper position, the second main transfer robot CR2 faces the third exit/entrance port 13A of the third processing unit 17 between the uppermost third processing unit 17 and the lowermost third processing unit 17. As described above, the second main transfer robot CR2 is located so as to face the second exit/entrance port 12A and the third exit/entrance port 13A.

The second main transfer robot CR2 can make the second main transfer hand 81 face the second exit/entrance port 12A of the second processing unit 16 from the horizontal direction. In this state, the second main transfer robot CR2 accesses the second processing unit 16 through the second exit/entrance port 12A, and thereby can carry the substrate W into and out of the second processing unit 16.

The second main transfer robot CR2 can make the second main transfer hand 81 face the third exit/entrance port 13A of the third processing unit 17 from the horizontal direction. In this state, the second main transfer robot CR2 accesses the third processing unit 17 through the third exit/entrance port 13A, and thereby can carry the substrate W into and out of the third processing unit 17.

The second main transfer robot CR2 is pivoted by the second main transfer robot pivoting unit 92 and is raised and lowered by the second main transfer robot raising/lowering unit 93, and thus the second main transfer robot CR2 makes the second main transfer hand 81 face the second placement unit 32 from the X direction. In this state, the second main transfer robot CR2 accesses the second placement unit 32 and thereby can place the substrate W on the second placement unit 32 and receive the substrate W placed on the second placement unit 32.

The second main transfer robot CR2 is preferably located such that a distance between a position where the substrate W is placed within the second processing chamber 16a of the second processing unit 16 and the second main transfer robot CR2, a distance between a position where the substrate W is placed within the third processing chamber 17a of the third processing unit 17 and the second main transfer robot CR2 and a distance between a position where the substrate W is placed in the second placement unit 32 and the second main transfer robot CR2 are equal to each other in plan view.

The substrate processing apparatus 1 further includes a first cover 101 which shields an atmosphere around the reception/delivery region A1 (especially, an atmosphere of the holding unit 5 side) and an atmosphere around (especially, the first exit/entrance port 11A of) the first processing portions 11 from each other, a second cover 102 which shields the atmosphere around (especially, the first exit/entrance port 11A of) the first processing portions 11 and an atmosphere around (especially, the second exit/entrance port 12A of) the second processing portions 12 from each other, and a third cover 103 which shields an atmosphere (especially, the third exit/entrance port 13A of) around the third processing portions 13 and an atmosphere outside the substrate processing apparatus 1 from each other. One side surface of the first cover 101 is attached to the first processing unit 15, and the other side surface of the first cover 101 is attached to the first main transfer robot raising/lowering unit 73. The first cover 101 is divided into an upper portion and a lower portion. The upper portion of the first cover 101 is positioned above the first placement unit 31, and the lower portion of the first cover 101 is positioned below the first placement unit 31. Hence, the first main transfer robot CR1 can receive and deliver the substrate W from and to the first placement unit 31 without being obstructed by the first cover 101.

One side surface of the second cover 102 is attached to the second processing unit 16, and the other side surface of the second cover 102 is attached to the second processing unit 16 on the opposite side across the transfer path 6. The second cover 102 is divided into an upper portion and a lower portion. The upper portion of the second cover 102 is positioned above the second placement unit 32. The lower portion of the second cover 102 is positioned below the second placement unit 32. Hence, the second main transfer robot CR2 can receive and deliver the substrate W from and to the second placement unit 32 without being obstructed by the second cover 102.

The transfer operation of the substrate W by the indexer robot IR, the first main transfer robot CR1 and the second main transfer robot CR2 will then be described.

FIGS. 3A to 3F are schematic plan views for illustrating the transfer operation of the substrate W by the indexer robot IR, the first main transfer robot CR1 and the second main transfer robot CR2. In a state shown in FIG. 3A, in the processing units which are located on the upper side of the plane of the figure with respect to the transfer path 6 among the processing units 15 to 17, the substrate W is not accommodated.

For clarification, in FIGS. 3A to 3F, the substrates W which are placed on the first placement unit 31 and the second placement unit 32 are indicated by solid lines. Moreover, for clarification, in FIGS. 3A to 3F, the indexer hand 41, the first main transfer hand 61 and the second main transfer hand 81 which access the first placement unit 31 and the second placement unit 32 are shown by solid lines. However, the portions of the indexer hand 41, the first main transfer hand 61 and the second main transfer hand 81 which are positioned below the substrate W are indicated by broken lines.

Figure 3A:
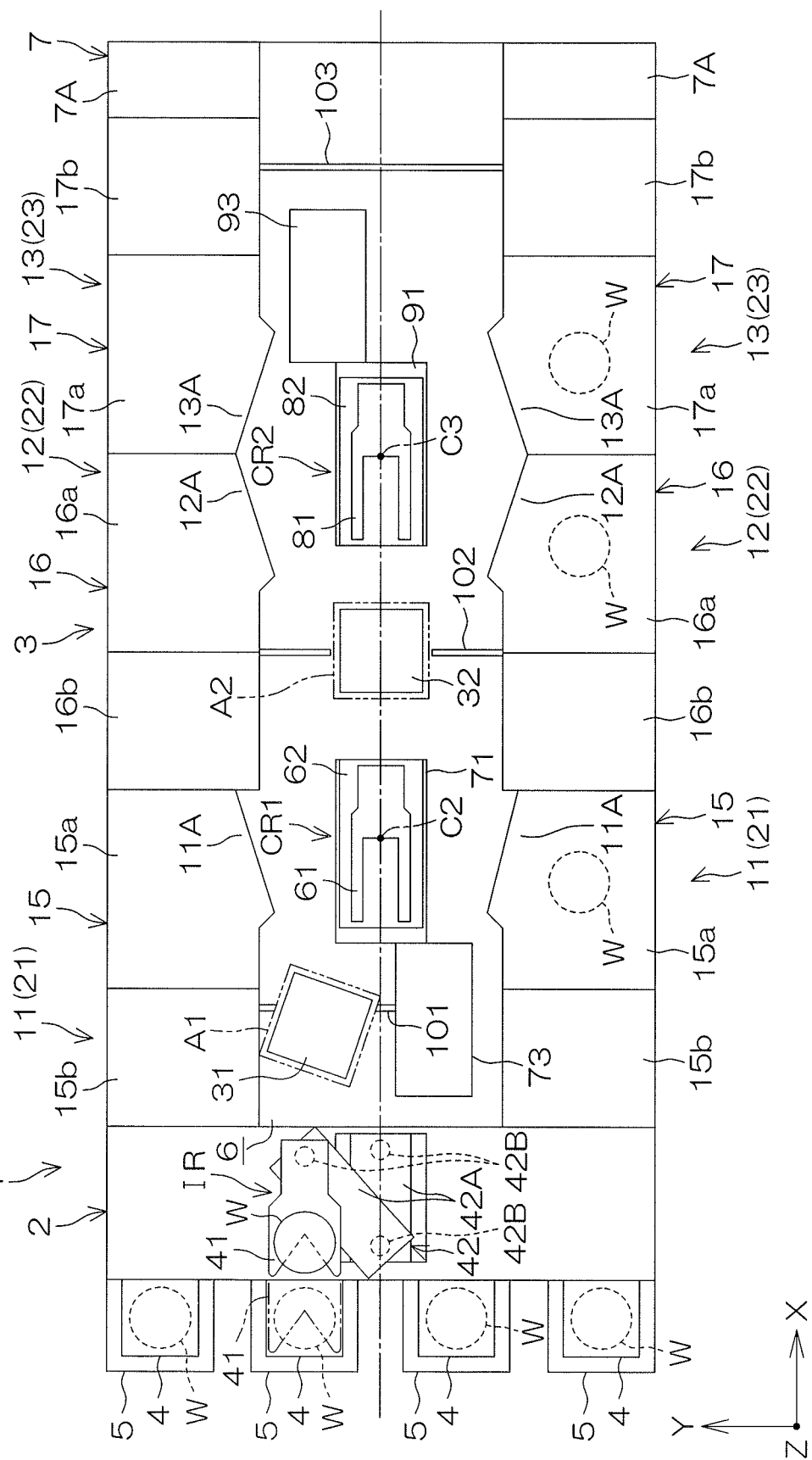
FIG. 3A is a schematic plan view for illustrating the transfer operation of a substrate by a transfer robot included in the substrate processing apparatus.

The indexer robot IR is first moved by the indexer robot raising/lowering unit 53 into the lower position. As shown in FIG. 3A, the indexer hand 41 is moved by the movement unit 52 such that the indexer hand 41 can access the container 4 of any of the holding units 5 (for example, the holding unit 5 located second from the upper portion of the plane of FIG. 3A). Thereby, as indicated by chain double-dashed lines in FIG. 3A, the indexer robot IR receives an unprocessed substrate W (a substrate before processing) from the container 4. Then, the indexer hand 41 is moved by the movement unit 52 so as to be retracted from the container 4.

Figure 3B:
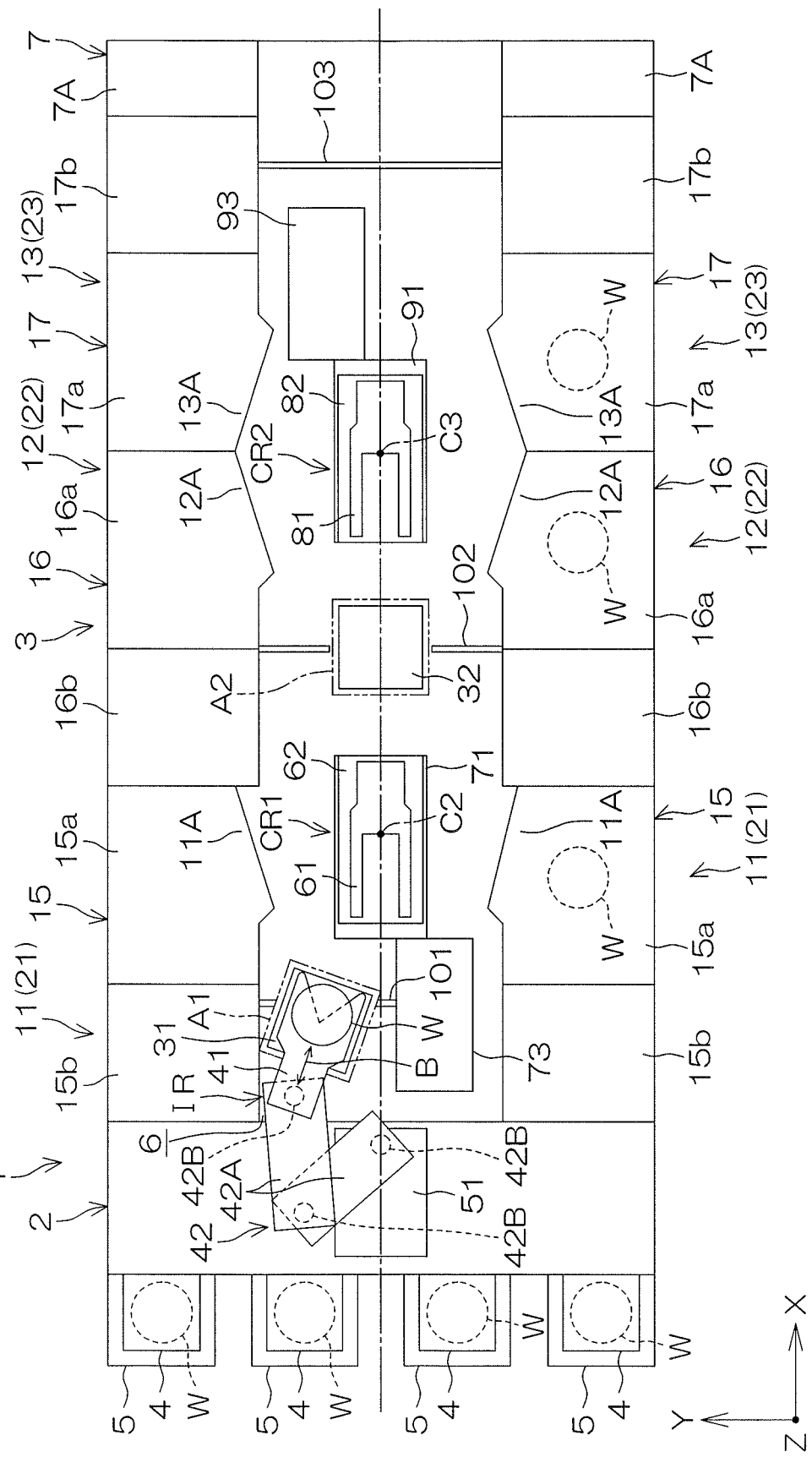
FIG. 3B is a schematic plan view for illustrating the transfer operation of a substrate by the transfer robot included in the substrate processing apparatus.

Thereafter, the indexer robot IR is moved by the indexer robot raising/lowering unit 53 into the upper position. As shown in FIG. 3B, the indexer hand 41 of the indexer robot IR is moved by the movement unit 52 in a direction B inclined with respect to the X direction, and accesses the first placement unit 31 located in the reception/delivery region A1. Thereby, the unprocessed substrate W is placed on the first placement unit 31. Here, the substrate W held by the indexer hand 41 is also moved in the direction B inclined with respect to the X direction. The direction B is the horizontal direction and is inclined with respect to the X direction in plan view.

Figure 3C:
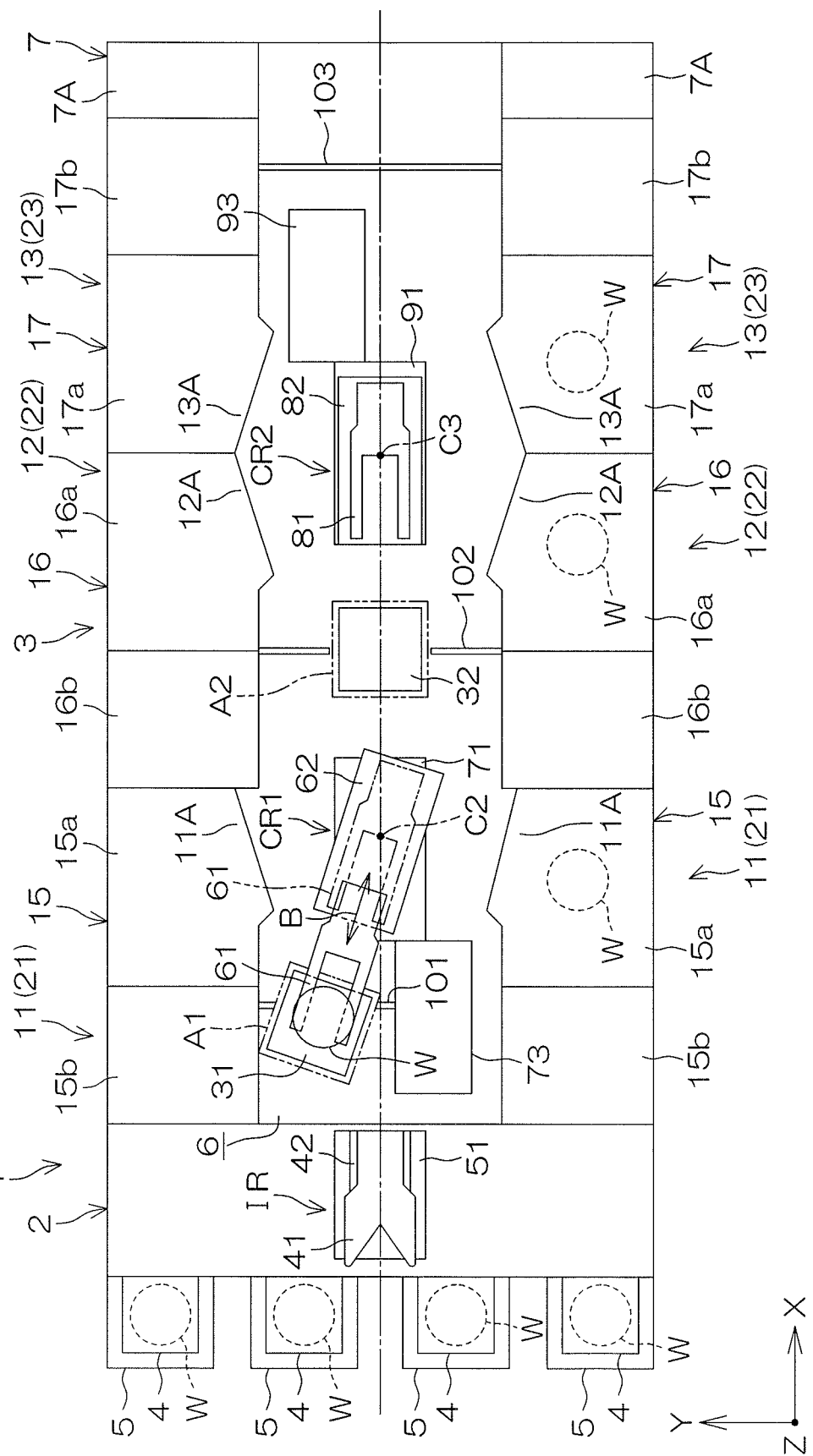
FIG. 3C is a schematic plan view for illustrating the transfer operation of a substrate by the transfer robot included in the substrate processing apparatus.

Then, the first main transfer robot CR1 is moved by the first main transfer robot pivoting unit 72 and the first main transfer robot raising/lowering unit 73 into a position (position indicated by chain double-dashed lines in FIG. 3C) at which the first main transfer hand 61 faces the first placement unit 31. In a state where the first main transfer hand 61 faces the first placement unit 31, the first main transfer hand 61 is linearly moved by the first main transfer hand advance/retraction unit 74 in the direction B toward the advance position. As shown in FIG. 3C, the first main transfer hand 61 accesses the first placement unit 31 at a position between the retraction position and the advance position and receives the unprocessed substrate W from the first placement unit 31.

Thereafter, the first main transfer hand 61 is linearly moved by the first main transfer hand advance/retraction unit 74 in the direction B so as to be positioned at the retraction position, and is returned to the position indicated by chain double-dashed lines in FIG. 3C. Here, the substrate W held by the first main transfer hand 61 is also moved in the direction B. As described above, the unprocessed substrate W is delivered through the first placement unit 31 from the indexer robot IR to the first main transfer robot CR1. The first main transfer robot CR1 having received the unprocessed substrate W is moved by the first main transfer robot pivoting unit 72 and the first main transfer robot raising/lowering unit 73 into a position (see FIG. 3D) at which the first main transfer hand 61 faces the first exit/entrance port 11A of the first processing unit 15 or a position (see FIG. 3E) at which the first main transfer hand 61 faces the second placement unit 32.

Figure 3D:
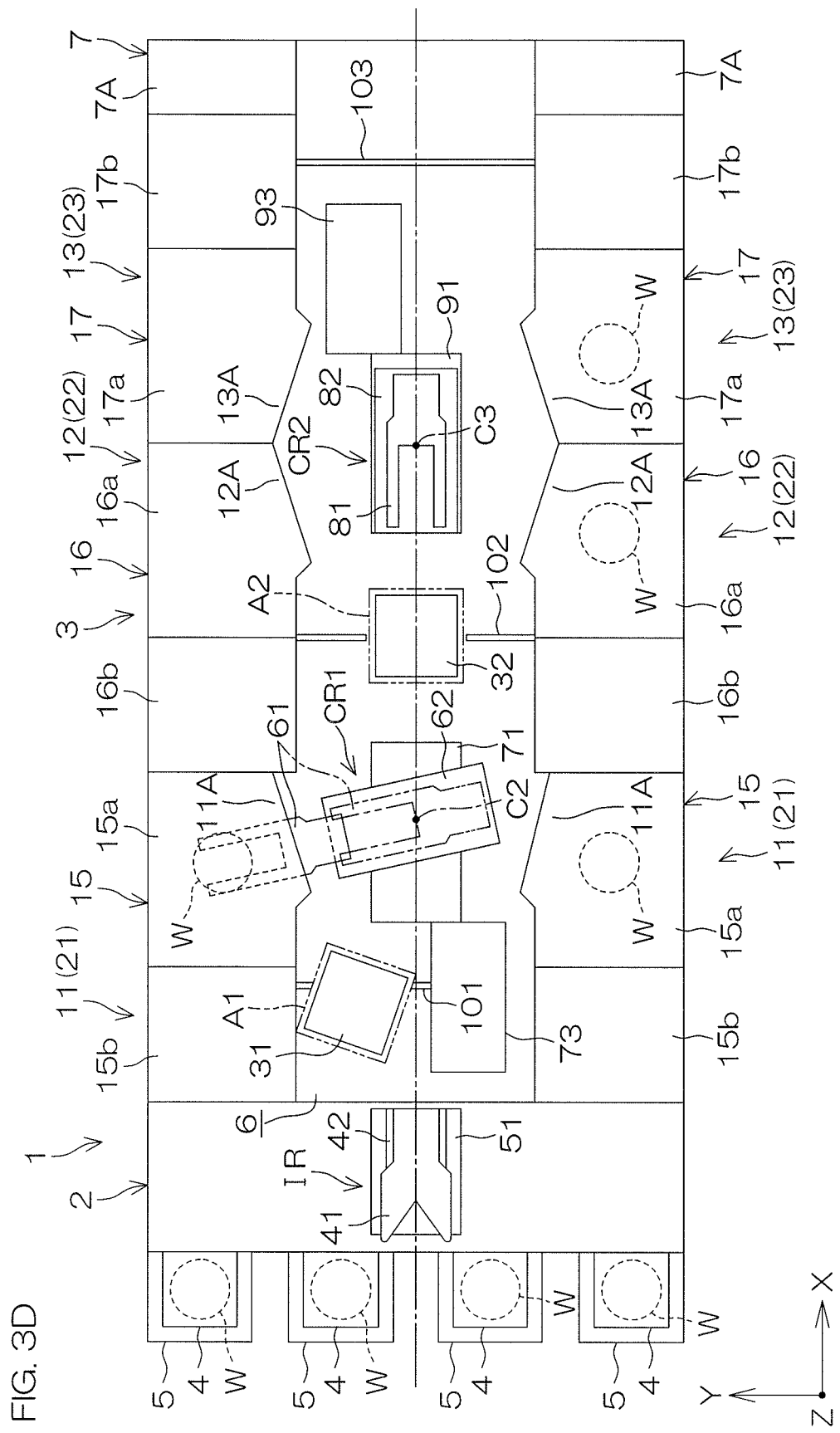
FIG. 3D is a schematic plan view for illustrating the transfer operation of a substrate by the transfer robot included in the substrate processing apparatus.

With reference to FIG. 3D, when the unprocessed substrate W is processed in the first processing unit 15, in a state where the first main transfer hand 61 faces the first exit/entrance port 11A of the first processing unit 15, the first main transfer hand 61 is linearly moved by the first main transfer hand advance/retraction unit 74 so as to be positioned at the advance position. In this way, the first main transfer hand 61 accesses the first processing unit 15 at a position between the retraction position and the advance position and places the substrate W into the first processing chamber 15*a*. Thereafter, the first main transfer hand 61 is linearly moved by the first main transfer hand advance/retraction unit 74 so as to be positioned at the retraction position. As described above, the unprocessed substrate W is transferred between the container 4 held by the holding unit 5 and the first processing unit 15. Thereafter, the substrate W is processed by the first processing unit 15 for a predetermined time, and is then received by the first main transfer robot CR1.

Figure 3E:
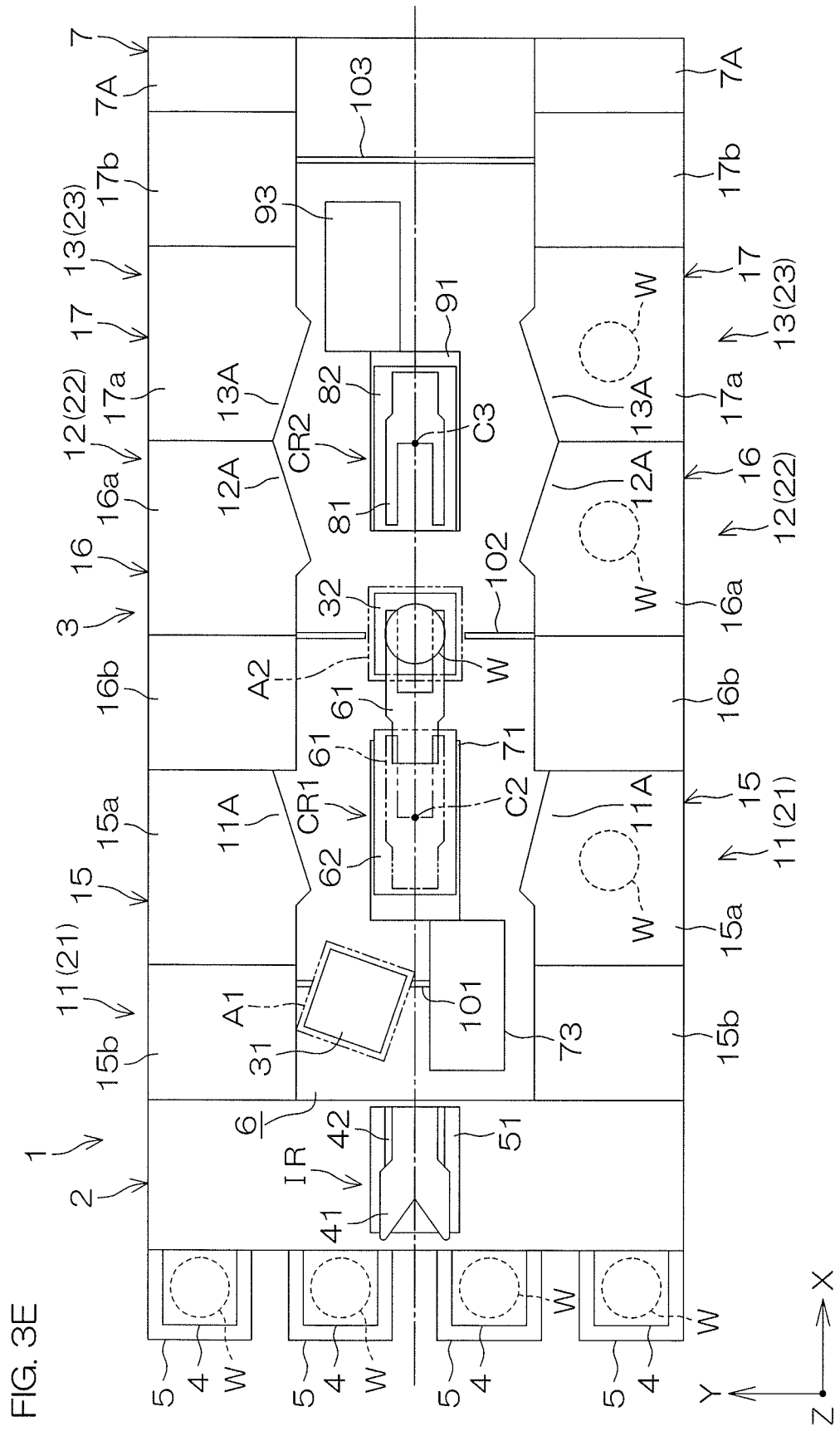
FIG. 3E is a schematic plan view for illustrating the transfer operation of a substrate by the transfer robot included in the substrate processing apparatus.

When the unprocessed substrate W is processed by the second processing unit 16 or the third processing unit 17, with reference to FIG. 3E, in a state where the first main transfer hand 61 faces the second placement unit 32, the first main transfer hand 61 is linearly moved by the first main transfer hand advance/retraction unit 74 so as to be positioned at the advance position. In this way, the first main transfer hand 61 accesses the second placement unit 32 at a position between the retraction position and the advance position and places the unprocessed substrate W on the second placement unit 32.

Figure 3F:
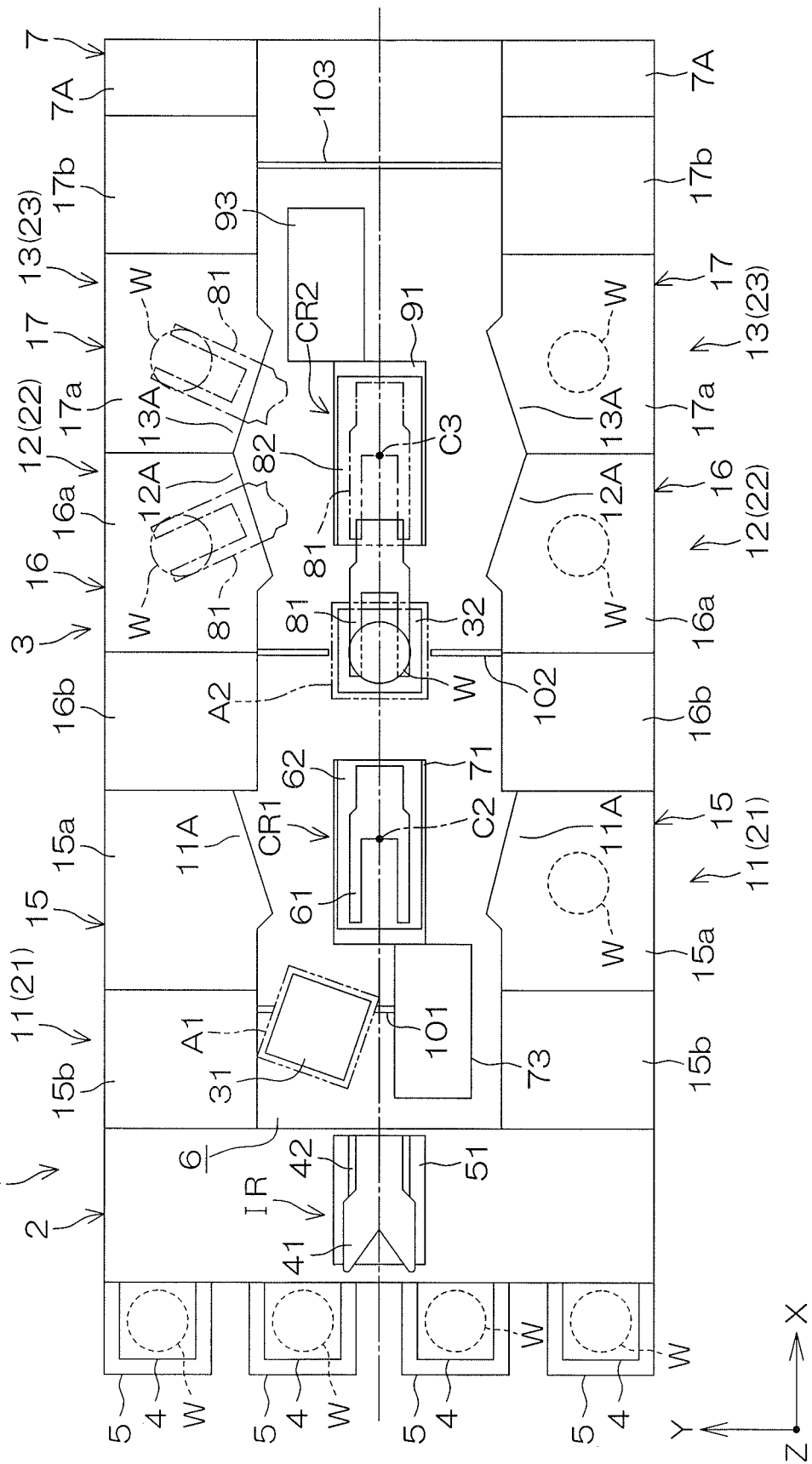
FIG. 3F is a schematic plan view for illustrating the transfer operation of a substrate by the transfer robot included in the substrate processing apparatus.

Then, with reference to FIG. 3F, the second main transfer robot CR2 is moved by the second main transfer robot pivoting unit 92 and the second main transfer robot raising/lowering unit 93 into a position at which the second main transfer hand 81 faces the second placement unit 32. In a state where the second main transfer hand 81 faces the second placement unit 32, the second main transfer hand 81 is linearly moved in the X direction by the second main transfer hand advance/retraction unit 94 so as to be positioned at the advance position. The second main transfer hand 81 accesses the second placement unit 32 at a position between the retraction position and the advance position and receives the unprocessed substrate W from the second placement unit 32. In this way, the unprocessed substrate W is delivered through the second placement unit 32 to the second main transfer robot CR2.

Thereafter, the second main transfer hand 81 is linearly moved in the X direction by the second main transfer hand advance/retraction unit 94 so as to be positioned at the retraction position. The second main transfer robot CR2 having received the unprocessed substrate W is moved by the second main transfer robot pivoting unit 92 and the second main transfer robot raising/lowering unit 93 into a position at which the second main transfer hand 81 faces the second exit/entrance port 12A of the second processing unit 16 or the third exit/entrance port 13A of the third processing unit 17.

In a state where the second main transfer hand 81 faces the second exit/entrance port 12A of the second processing unit 16 or the third exit/entrance port 13A of the third processing unit 17, the second main transfer hand 81 is linearly moved by the second main transfer hand advance/retraction unit 94 so as to be positioned at the advance position. In this way, the second main transfer hand 81 accesses the second processing unit 16 or the third processing unit 17 at a position between the retraction position and the advance position and places the substrate W into the second processing chamber 16*a* or the third processing chamber 17*a* (see chain single-dashed lines in FIG. 3F). Thereafter, the second main transfer hand 81 is linearly moved by the second main transfer hand advance/retraction unit 94 so as to be positioned at the retraction position. As described above, the unprocessed substrate W is transferred between the container 4 held by the holding unit 5 and the second processing unit 16 or the third processing unit 17.

The substrate W processed for a predetermined time in the second processing unit 16 or the third processing unit 17 is received by the second main transfer robot CR2 and is delivered through the second placement unit 32 from the second main transfer robot CR2 to the first main transfer robot CR1.

The substrate W processed by the processing portions 11 to 13 is placed by the first main transfer robot CR1 on the first placement unit 31. Specifically, the first main transfer robot CR1 is moved by the first main transfer robot pivoting unit 72 and the first main transfer robot raising/lowering unit 73 into a position at which the first main transfer hand 61 faces the first placement unit 31. In a state where the first main transfer hand 61 faces the first placement unit 31, the first main transfer hand 61 is linearly moved in the direction B inclined with respect to the X direction so as to be positioned at the advance position. Here, the substrate W held in the first main transfer hand 61 is also moved in the direction B. At a position between the retraction position and the advance position, the first main transfer hand 61 accesses the first placement unit 31 and places the processed substrate W on the first placement unit 31.

Then, the indexer robot IR is moved by the indexer robot raising/lowering unit 53 into the upper position. The indexer hand 41 is moved by the movement unit 52 such that the indexer hand 41 can access the first placement unit 31. In this way, the indexer hand 41 receives the processed substrate W. The indexer hand 41 is moved by the movement unit 52 in the direction B so as to be retracted from the first placement unit 31. Here, the substrate W held in the first main transfer hand 61 is also moved in the direction B. In this way, the processed substrate W is delivered through the first placement unit 31 from the first main transfer robot CR1 to the indexer robot IR. Then, the processed substrate W is accommodated by the indexer robot IR into the container 4 held by the holding unit 5. As described above, the processed substrate W is transferred between the first processing unit 15, the second processing unit 16 or the third processing unit 17 and the container 4 held by the holding unit 5.

According to this embodiment, the first main transfer robot CR1 carries the substrate W into and out of the first processing portion 11 through the first exit/entrance port 11A. Further, the second main transfer robot CR2 carries the substrate W into and out of the second processing portion 12 through the second exit/entrance port 12A and carries the substrate W into and out of the third processing portion 13 through the third exit/entrance port 13A. Therefore, as compared with a configuration in which one transfer robot which carries the substrate W into and out of the processing portions 11 to 13 is provided for each thereof, the number of the transfer robots can be reduced. The number of times the substrate W is received and delivered between the indexer robot IR, the first main transfer robot CR1 and the second main transfer robot CR2 is reduced, and thus it is possible to enhance the transfer efficiency.

As described above, in the configuration in which three processing portions 11 to 13 are located so as to be aligned in the X direction, while the substrate W is highly efficiently transferred, the number of transfer robots can be reduced.

The first main transfer robot CR1 and the second main transfer robot CR2 are located between the first processing portion 11 and the third processing portion 13. Therefore, it is also possible to design a layout in which the first main transfer robot CR1 can easily access the first processing portion 11, in which the second main transfer robot CR2 can also easily access the second processing portion 12 and the third processing portion 13, and in which the first main transfer robot CR1 can easily receive and deliver the substrate W from and to the second main transfer robot CR2.

The second exit/entrance port 12A is positioned on the side opposite to the side of the holding units 5 with respect to the center of the second processing portion 12 in the X direction. Hence, the second main transfer robot CR2 can easily access the second exit/entrance port 12A. Thus, the second main transfer robot CR2 can highly efficiently carry the substrate W into and out of the second processing portion 12.

Since the first main transfer robot CR1 is located so as to face the first exit/entrance port 11A, the first main transfer robot CR1 can easily carry the substrate W into and out of the first processing portion 11. Hence, the first main transfer robot CR1 can highly efficiently carry the substrate W into and out of the first processing portion 11. The second main transfer robot CR2 is located so as to face the second exit/entrance port 12A and the third exit/entrance port 13A. Hence, carrying the substrate W into and out of the second processing portion 12 and the third processing portion 13 is easily performed. Thus, the second main transfer robot CR2 can highly efficiently carry the substrate W into and out of the second processing portion 12 and the third processing portion 13. Therefore, it is possible to enhance the transfer efficiency of the substrate W by the first main transfer robot CR1 and the second main transfer robot CR2.

Further, the substrate W can be placed on the second placement unit 32 when the substrate W is received and delivered between the first main transfer robot CR1 and the second main transfer robot CR2. Therefore, it is not necessary to synchronize the timing at which the first main transfer robot CR1 and the second main transfer robot CR2 access the second placement unit 32 in order to receive and deliver the substrate W. Thus, the degree of freedom of the operation of the first main transfer robot CR1 and the second main transfer robot CR2 is increased. Accordingly, it is possible to enhance the transfer efficiency of the substrate by the first main transfer robot CR1 and the second main transfer robot CR2. Consequently, it is possible to enhance the transfer efficiency of the substrate W in the substrate processing apparatus 1.

The first placement unit 31 is positioned between the indexer robot IR and the first main transfer robot CR1. Hence, it is possible to shorten a distance over which the indexer robot IR and the first main transfer robot CR1 are moved when the substrate W is received and delivered between the indexer robot IR and the first main transfer robot CR1. Consequently, it is possible to enhance the transfer efficiency of the substrate W.

The first main transfer robot raising/lowering unit 73 is positioned between the indexer robot IR and the first main transfer robot CR1. Hence, the first main transfer robot CR1 can be raised and lowered, while suppressing the influence on the disposition of the second main transfer robot CR2 as compared with the case where the first main raising/lowering unit 73 is positioned on the opposite side of the indexer robot IR with respect to the first main transfer robot CR1. In this way, since the degree of freedom of the configuration of the second main transfer robot CR2 is increased, it is possible to easily perform a design for reducing the size of the substrate processing apparatus 1 and maximizing the transfer efficiency of the substrate W.

The reception/delivery region A1 and the first main transfer robot raising/lowering unit 73 are aligned in a direction (for example, the Y direction) intersecting the X direction. Therefore, the first placement unit 31 and the first main transfer robot raising/lowering unit 73 can be located within the transfer path 6 without the length of the transfer path 6 from the indexer robot IR to the first main transfer robot CR1 being increased. Thus, it is possible to reduce the size of the substrate processing apparatus 1 and to enhance the transfer efficiency of the substrate W.

The second placement unit 32 is positioned between the first main transfer robot CR1 and the second main transfer robot CR2. Hence, it is possible to shorten a distance over which the first main transfer robot CR1 and the second main transfer robot CR2 are moved so that the substrate W is received and delivered between the first main transfer robot CR1 and the second main transfer robot CR2. Consequently, it is possible to enhance the transfer efficiency of the substrate W.

In each of the processing blocks 21 to 23, the pairs of processing portions 11 to 13 are opposite each other across the transfer path 6. Thus, it is possible to increase the number of processing portions 11 to 13 into and out of which the first main transfer robot CR1 and the second main transfer robot CR2 carry the substrate W.

According to this configuration, the following effects are also obtained.

Between the container 4 held by the holding unit 5 and the processing portions 11 to 13, the substrate W is transferred by the indexer robot IR and the first main transfer robot CR1. At that time, the substrate W is passed through the transfer path 6 which extends so as to be passed on a lateral side of the first processing portions 11. Within this transfer path 6, the reception/delivery region A1 in which the substrate W is received and delivered between the indexer robot IR and the first main transfer robot CR1 is set. Furthermore, within the transfer path 6, the first main transfer robot raising/lowering unit 73 is located, and the first main transfer robot raising/lowering unit 73 is positioned between the indexer robot IR and the first main transfer robot CR1. In this way, as compared with a case where the first main transfer robot raising/lowering unit 73 is located on the side opposite to the indexer robot IR with respect to the first main transfer robot CR1, it is possible to shorten the transfer path length necessary for the transfer of the substrate W to the first processing unit 15 of the first processing portions 11. The transfer path length which is necessary for transferring the substrate W to the first processing portion 11 of the first processing unit 15 is the length of the transfer path 6 from the indexer robot IR to the first main transfer robot raising/lowering unit 73 in the X direction. Hence, it is possible to reduce the size of the substrate processing apparatus 1 and thus it is possible to reduce the occupied area of the substrate processing apparatus 1.

Since the reception/delivery region A1 and the first main transfer robot raising/lowering unit 73 are aligned in a direction (for example, the Y direction) intersecting the X direction (direction in which the linear transfer path 6 extends), it is possible to further shorten the transfer path length necessary for transferring the substrate W to the first processing unit 15 of the first processing portion 11.

Since the direction B in which the substrate W is moved when the substrate W is received and delivered between the indexer robot IR and the first main transfer robot CR1 is inclined with respect to the X direction in plan view, the reception/delivery region A1 and the first main transfer robot raising/lowering unit 73 are easily aligned in the direction intersecting the X direction. Hence, it is possible to easily perform a design in which the transfer path length necessary for transferring the substrate W to the first processing unit 15 of the first processing portion 11 is still further shortened.

On the first placement unit 31 located in the reception/delivery region A1, the substrate W is placed so that the substrate W is received and delivered between the indexer robot IR and the first main transfer robot CR1. Hence, it is not necessary to synchronize the timing at which the indexer robot IR and the first main transfer robot CR1 access the reception/delivery region A1 in order to receive and deliver the substrate W. Thus, the degree of freedom of the operation of the indexer robot IR and the first main transfer robot CR1 is increased. Consequently, it is possible to enhance the transfer efficiency of the substrate W by the indexer robot IR and the first main transfer robot CR1.

The transfer efficiency of the substrate W by the indexer robot IR is enhanced as the position of the container 4 in the Z direction is closer to the position of the first placement unit 31 in the Z direction. On the other hand, the transfer efficiency of the substrate W by the first main transfer robot CR1 is enhanced as the position of the center C of the first processing portion 11 in the Z direction is closer to the position of the first placement unit 31 in the Z direction. Since the first placement unit 31 is positioned in the Z direction between the container 4 held by the holding unit 5 and the center C of the first processing portion 11 in the Z direction, the first placement unit 31 is easily accessed with efficiency both by the indexer robot IR and the first main transfer robot CR1. Hence, it is possible to enhance the transfer efficiency of the substrate W.

The first placement unit 31 is positioned in the Z direction at a center position between the lower position of the indexer robot IR and the center C of the first processing portion 11 in the Z direction. Thus, it is possible to have a balance between the transfer efficiency of the substrate W by the indexer robot IR and the transfer efficiency of the substrate W by the first main transfer robot CR1, with the result that it is possible to enhance the transfer efficiency as a whole.

Since the pairs of processing portions 11 to 13 face each other across the transfer path 6, it is possible to increase the number of processing portions 11 to 13 without increasing the length of the transfer path 6.

The atmosphere around the reception/delivery region A1 (especially, the atmosphere of the holding unit 5 side) and the atmosphere around (especially, the first exit/entrance port 11A of) the first processing portion 11 are shielded from each other by the first cover 101 attached to the first main transfer robot raising/lowering unit 73. Hence, for example, even when the atmosphere of a processing fluid used for processing the substrate W in the first processing portion 11 is present in the atmosphere around the first processing portion 11, it is possible to reduce or prevent the contamination of the indexer robot IR (in particular, the indexer hand 41) which accesses the reception/delivery region A1 by vapor of the processing liquid.

Furthermore, since the first main transfer robot raising/lowering unit 73 is positioned together with the reception/delivery region A1 between the indexer robot IR and the first main transfer robot CR1, the first main transfer robot raising/lowering unit 73 is positioned relatively close to the reception/delivery region A1. Hence, the first cover 101 can be attached to the first main transfer robot raising/lowering unit 73. Moreover, since part of the transfer path 6 is shielded with the first main transfer robot raising/lowering unit 73, the first cover 101 is attached to the first main transfer robot raising/lowering unit 73, and thus it is possible to reduce the size of the first cover 101.

The first processing portion 11 which is the close processing portion includes the first exit/entrance port 11A on the side opposite to the side of the holding unit 5 with respect to the center of the first processing portion 11 in the X direction. The third processing portion 13 which is the remote processing portion includes the third exit/entrance port 13A on the side of the holding units 5 with respect to the third processing portion 13 in the X direction.

Hence, the first main transfer robot CR1 is located between the first processing portions 11 and the second processing portions 12, the second main transfer robot CR2 is located between the second processing portions 12 and the third processing portions 13, and thus either one of the transfer robots CR1 and CR2 can access all of the processing portions 11 to 13. Thus, it is not necessary to provide the transfer robot in a position away from the holding unit 5 further than the third processing portion 13 (remote processing portion). Therefore, since, in the configuration in which three processing portions 11 to 13 are aligned in the X direction, it is not necessary to provide the transfer robot in a position away from the holding unit 5 further than the third processing portion 13, it is possible to reduce the size and cost of the substrate processing apparatus 1.

Unlike this preferred embodiment, four or more processing portions may be located in the X direction. Even in this case, with a configuration in which the close processing portion includes the exit/entrance port on the side opposite to the side of the holding units 5 with respect to the center of the close processing portion in the X direction, and in which the remote processing portion includes the exit/entrance port on the side of the holding units 5 with respect to the center of the remote processing portion in the X direction, it is not necessary to provide the transfer robot in a position away from the holding unit 5 further than with the remote processing portion. Consequently, it is possible to reduce the size of the substrate processing apparatus 1.

The present invention is not limited to the preferred embodiments described above, and the present invention can be practiced with yet other preferred embodiments.

For example, the indexer robot IR may be configured to directly receive and deliver the substrate W from and to the first main transfer robot CR1. In this case, the reception and delivery of the substrate W is performed in the reception/delivery region A1. In this case, the substrate processing apparatus 1 does not need to include the first placement unit 31.

When the substrate W is directly received and delivered between the indexer robot IR and the first main transfer robot CR1, the indexer hand 41 and the first main transfer hand 61 may have a mutually meshed shape such that they do not overlap each other in plan view, in order to prevent interference when the substrate W is received and delivered between the indexer robot IR and the first main transfer robot CR1.

Likewise, the substrate W may be configured to directly received and delivered between the first main transfer robot CR1 and the second main transfer robot CR2. In this case, the reception and delivery of the substrate W is performed in the reception/delivery region A2.

For each of the processing portions 11 to 13, the pair thereof is not always needed to be provided, and at least any one of the processing portions 11 to 13 may be located only on one side of the transfer path 6.

The indexer robot IR may include a plurality of indexer hands 41. The indexer hands 41 may be spaced in the Z direction and may be moved independently of each other. In this case, the indexer robot IR may be configured such that while carrying the unprocessed substrate W from the container 4, the indexer robot IR can carry the processed substrate W into another container 4. The indexer robot IR may also be configured such that while receiving the processed substrate W from the first placement unit 31, the indexer robot IR can place the unprocessed substrate W on the first placement unit 31.

Likewise, the first main transfer robot CR1 may include a plurality of first main transfer hands 61. The first main transfer hands 61 may be spaced in the Z direction. In this case, the first main transfer robot CR1 may be configured such that while receiving the processed substrate W from the second placement unit 32 or the first processing portion 11, the first main transfer robot CR1 can place the unprocessed substrate W on the second placement unit 32 or the first processing portion 11. The first main transfer robot CR1 may also be configured such that while receiving the unprocessed substrate W from the first placement unit 31, the first main transfer robot CR1 can place the processed substrate W on the first placement unit 31.

Likewise, the second main transfer robot CR2 may include a plurality of second main transfer hands 81, and may be configured such that the second main transfer robot CR2 can carry the substrates W into and out of the second processing portion 12 and the third processing portion 13 at a time or maybe configured such that the second main transfer robot CR2 can place and receive the substrates W on and from the second placement unit 32 at a time.

While preferred embodiments of the present invention have been described in detail above, these are simply specific examples used to clarify the technical contents of the present invention, the present invention should not be interpreted as being limited to these specific examples and the scope of the present invention shall be limited only by the appended claims.

The present application corresponds to Japanese Patent Application No. 2016-048714 filed in the Japan Patent Office on Mar. 11, 2016, and the entire disclosure of this application is incorporated herein by reference.

REFERENCE SIGNS LIST

: Substrate processing apparatus 4: Container 5: Holding unit 6: Transfer path 11: First processing portion 11A: First exit/entrance port 12: Second processing portion 12A: Second exit/entrance port 13: Third processing portion 13A: Third exit/entrance port 21: First processing block 22: Second processing block 23: Third processing block 31: First placement unit 32: Second placement unit 73: First main transfer robot raising/lowering unit (Raising/lowering unit) W: Substrate X: First direction (Direction in which the transfer path extends) IR: Indexer robot (First transfer robot) CR1: First main transfer robot (Second transfer robot) CR2: Second main transfer robot (Third transfer robot)

What is claimed is:

1. A substrate processing apparatus comprising:
a holding unit which holds a container accommodating a substrate;
a first processing portion which processes the substrate and has a first exit/entrance port for moving the substrate into and out;
a second processing portion which processes the substrate, which has a second exit/entrance port for moving the substrate into and out, and which is located so as to be adjacent to the first processing portion from the opposite side of the holding unit;
a third processing portion which processes the substrate, which has a third exit/entrance port for moving the substrate into and out, and which is located on the opposite side to the holding unit with respect to the second processing portion;
a transfer path which extends from the holding unit, wherein the substrate is transferred between the container held by the holding unit, and the first processing portion, the second processing portion and the third processing portion through the transfer path;
a first transfer robot which carries the substrate into and out of the container held by the holding unit;
a second transfer robot which receives and delivers the substrate from and to the first transfer robot, and carries the substrate into and out of the first processing portion through the first exit/entrance port; and
a third transfer robot which receives and delivers the substrate from and to the second transfer robot, carries the substrate into and out of the second processing portion through the second exit/entrance port, and carries the substrate into and out of the third processing portion through the third exit/entrance port,
wherein the first exit/entrance port faces the transfer path and is positioned at the opposite side of the holding unit with respect to the center of the first processing portion in a direction in which the transfer path extends, and
the second exit/entrance port faces the transfer path and is positioned at the opposite side of the holding unit with respect to the center of the second processing portion in the direction in which the transfer path extends.

2. The substrate processing apparatus according to claim 1, wherein the second transfer robot and the third transfer robot are located between the first processing portion and the third processing portion in the direction in which the transfer path extends.

3. The substrate processing apparatus according to claim 1, wherein the second transfer robot is located so as to face the first exit/entrance port, and
   the third transfer robot is located so as to face the second exit/entrance port and the third exit/entrance port.

4. The substrate processing apparatus according to claim 1, further comprising a first placement unit which is located within the transfer path, and on which the substrate is placed so that the substrate is received and delivered between the first transfer robot and the second transfer robot; and
   a second placement unit which is located within the transfer path and on which the substrate is placed so that the substrate is received and delivered between the second transfer robot and the third transfer robot.

5. The substrate processing apparatus according to claim 4, wherein the first placement unit is positioned between the first transfer robot and the second transfer robot.

6. The substrate processing apparatus according to claim 5, further comprising a raising/lowering unit which is located within the transfer path, and raises and lowers the second transfer robot,
   wherein the raising/lowering unit is positioned between the first transfer robot and the second transfer robot.

7. The substrate processing apparatus according to claim 6, wherein the transfer path extends linearly from the holding unit toward the second transfer robot, and the first placement unit and the raising/lowering unit are aligned in a direction crossing the direction in which the transfer path extends.

8. The substrate processing apparatus according to claim 4, wherein the second placement unit is positioned between the second transfer robot and the third transfer robot.

9. The substrate processing apparatus according to claim 1, comprising a first processing block which is configured with a pair of the first processing portions which are provided across the transfer path;
   a second processing block which is configured with a pair of the second processing portions which are provided across the transfer path; and
   a third processing block which is configured with a pair of the third processing portions which are provided across the transfer path.

10. The substrate processing apparatus according to claim 1, wherein the third processing portion is located so as to be adjacent to the second processing portion from the opposite side of the holding unit, and
    the third exit/entrance port faces the transfer path and is positioned at the holding unit side with respect to the center of the third processing portion in the direction in which the transfer path extends.

11. The substrate processing apparatus according to claim 1, wherein an entirety of the first exit/entrance port is positioned at the opposite side of the holding unit with respect to the center of the first processing portion in the direction in which the transfer path extends.

* * * * *